United States Patent
Chang et al.

(10) Patent No.: US 7,159,283 B2
(45) Date of Patent: Jan. 9, 2007

(54) LOCKING DEVICE FOR A PANEL

(75) Inventors: Hao-Chun Chang, Chi Lung (TW); Hou-An Su, Taipei Hsien (TW); Hui-Chun Kuo, Taipei Hsien (TW)

(73) Assignee: Nextronics Engineering Corp., Taipei Hsien (TW)

( * ) Notice: Subject to any disclaimer, the term of this patent is extended or adjusted under 35 U.S.C. 154(b) by 183 days.

(21) Appl. No.: 10/940,723

(22) Filed: Sep. 15, 2004

(65) Prior Publication Data

US 2006/0053599 A1 Mar. 16, 2006

(51) Int. Cl.
*A44B 21/00* (2006.01)
*H05K 7/20* (2006.01)

(52) U.S. Cl. .............................. 24/458; 24/457; 24/459

(58) Field of Classification Search .................. 24/455, 24/489, 457–459, 499, 502, 503, 505, 508, 24/509, 513, 515, 517, 600.2; 292/100, 106, 292/121, 126, 163, 173, 302, DIG. 37; 439/152–160
See application file for complete search history.

(56) References Cited

U.S. PATENT DOCUMENTS

| | | | | | |
|---|---|---|---|---|---|
| 395,513 A | * | 1/1889 | Powers | ......................... | 292/207 |
| 419,881 A | * | 1/1890 | Proctor | ................ | 292/DIG. 37 |
| 442,576 A | * | 12/1890 | Ferry | ......................... | 292/207 |
| 1,452,839 A | * | 4/1923 | Lotz | ............................ | 292/175 |
| 2,533,360 A | * | 12/1950 | Dath | ........................... | 292/207 |
| 2,565,862 A | * | 8/1951 | Levine | .......................... | 70/66 |
| 3,706,467 A | * | 12/1972 | Martin | ........................ | 292/111 |
| 4,629,209 A | * | 12/1986 | Lorenz et al. | .............. | 280/626 |
| 5,213,381 A | * | 5/1993 | Anderson | .................... | 292/111 |
| 5,735,025 A | * | 4/1998 | Bailey | ......................... | 24/600.1 |
| 6,203,075 B1 | * | 3/2001 | Wells et al. | ................. | 292/100 |
| 6,203,076 B1 | * | 3/2001 | Wytcherley et al. | ......... | 292/202 |
| 6,513,841 B1 | * | 2/2003 | Jackson | ....................... | 292/126 |
| 6,955,550 B1 | * | 10/2005 | Schlack | ........................ | 439/160 |
| 2005/0193531 A1 | * | 9/2005 | Cheng | ........................ | 24/600.2 |

* cited by examiner

*Primary Examiner*—Katherine Mitchell
*Assistant Examiner*—Ruth C. Rodriguez
(74) *Attorney, Agent, or Firm*—Rosenberg, Klein & Lee

(57) ABSTRACT

A locking device for a panel is provided for a single board computer for fixing onto the chassis of an industrial personal computer. The locking device includes a handle, a locking element, a first spring, a seat and a second spring. The handle has a concave groove at the front-end thereof for receiving the locking element. The first spring is placed in an inner of the locking element for abutting against an inner portion of the handle. The pin penetrates through the seat and the handle and fixes them together. The second spring is mounted on the pin and has an end hooked to the locking element. The locking element has a pressing portion. When the pressing portion is pressed, the handle and the locking element move back together through the pin as an axis.

9 Claims, 5 Drawing Sheets

LOCKING DEVICE FOR A PANEL

BACKGROUND OF THE INVENTION

1. Field of the Invention

The present invention relates to a locking device, and more particularly, to a locking device for a panel of a single board computer.

2. Description of the Related Art

The Industrial Personal Computer (IPC) is designed for various industrial, scientific, engineering, servers and telecommunication applications where Commercial Personal Computers do not work reliably and stably. Its rugged, sturdy, full-sealed and well-cooled steel chassis is specifically designed to meet EIA RS-310C 19" rack-mounted standard and withstand heavy shocks, particles, humidity, trembling, vibrations, and extremely high operating temperatures in harsh industrial environments. The single board computer is the core of the industrial personal computer. Its position is equal to the main-board of the personal computer having processors, memory products and chipsets, but it is smaller than the personal computer. For easy maintenance, it is designed with an interface card fixed on the passive black-plane, which is fixed at an inner portion of chassis.

Industrial personal computers are commonly used for controlling the production lines of automated factories. When they break down it leads to significant losses as the production line is often forced to shut down operations. Problems that cause such shut downs are often related to single board computers. So a device that replaces broken down single board computers with new ones, thereby reducing financial losses due to disruptions to production line stoppages is needed.

Referring to FIG. 1, which is a composition view of a conventional locking device of a panel in accordance with the prior art. A conventional locking device of the panel for removing broken-down industrial personal computers easily and for reducing losses due to production slowdowns or stoppages has already been invented. The conventional locking device of the panel includes a handle 10a, which is a lever which fixes onto the panel 40a. The handle 10a has a concave groove 16a with only one receiving finger. The handle has a locking element 20a at an inner portion thereof. The locking element 20a has a projecting portion 22a, which is pressed by a finger. While only one finger presses the projecting portion 22a the others finger lie against a front-end 14a of the handle 10a and two flanks 12a of it. It/The motherboard is then levered out by a pin 30a, so that a clasping portion 18a at a rear end of the handle 10a releases from the chassis of the industrial personal computer. Single board computers fixed in the chassis can be taken down for retooling through the conventional locking device of the panel.

However, when a conventional locking device of the panel is being used, one finger presses the projecting portion 22a while the other fingers lie against the front-end 14a of the handle 10a and the two flanks 12a. The handle 10a is levered out by the pin 30a, so that the clasping portion 18a at the rear end of it is released from the chassis of the industrial personal computer. This method is unergonomical, so it is an inconvenient way to retool an industrial single board computer.

SUMMARY OF THE INVENTION

It is therefore a principal objective of the present invention to provide a locking device of a panel, which is convenient to remove single board computers and reduces losses caused by subsequent stoppages of production lines. The present invention eliminates the aforesaid problem.

To achieve the above objective, one feature of the present invention is a locking device for a panel, including a handle; a locking element slidably arranged within the handle; a first spring placed in an inner of the locking element for abutting against an inner portion of the handle; a seat on which the handle is pivotally connected via a pin; and a second spring mounted on the pin and having an end hooked to locking element.

To provide a further understanding of the invention, the following detailed description illustrates embodiments and examples of the invention, this detailed description being provided only for illustrating the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
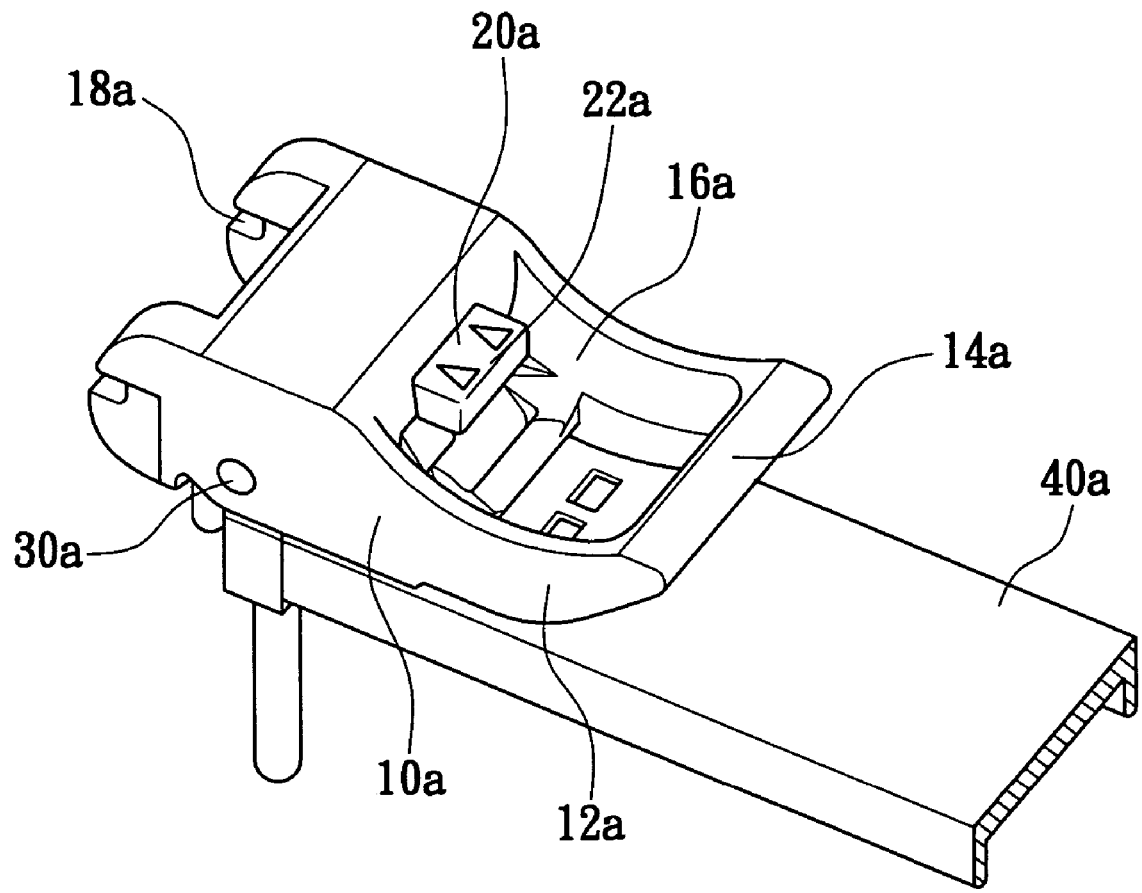
FIG. 1 is a perspective view of a conventional locking device of a panel in accordance with prior art.

Referring now to the drawings wherein the images are for the purpose of illustrating the preferred embodiments of the present invention only, not for limiting the scope of the invention.

Figure 2:
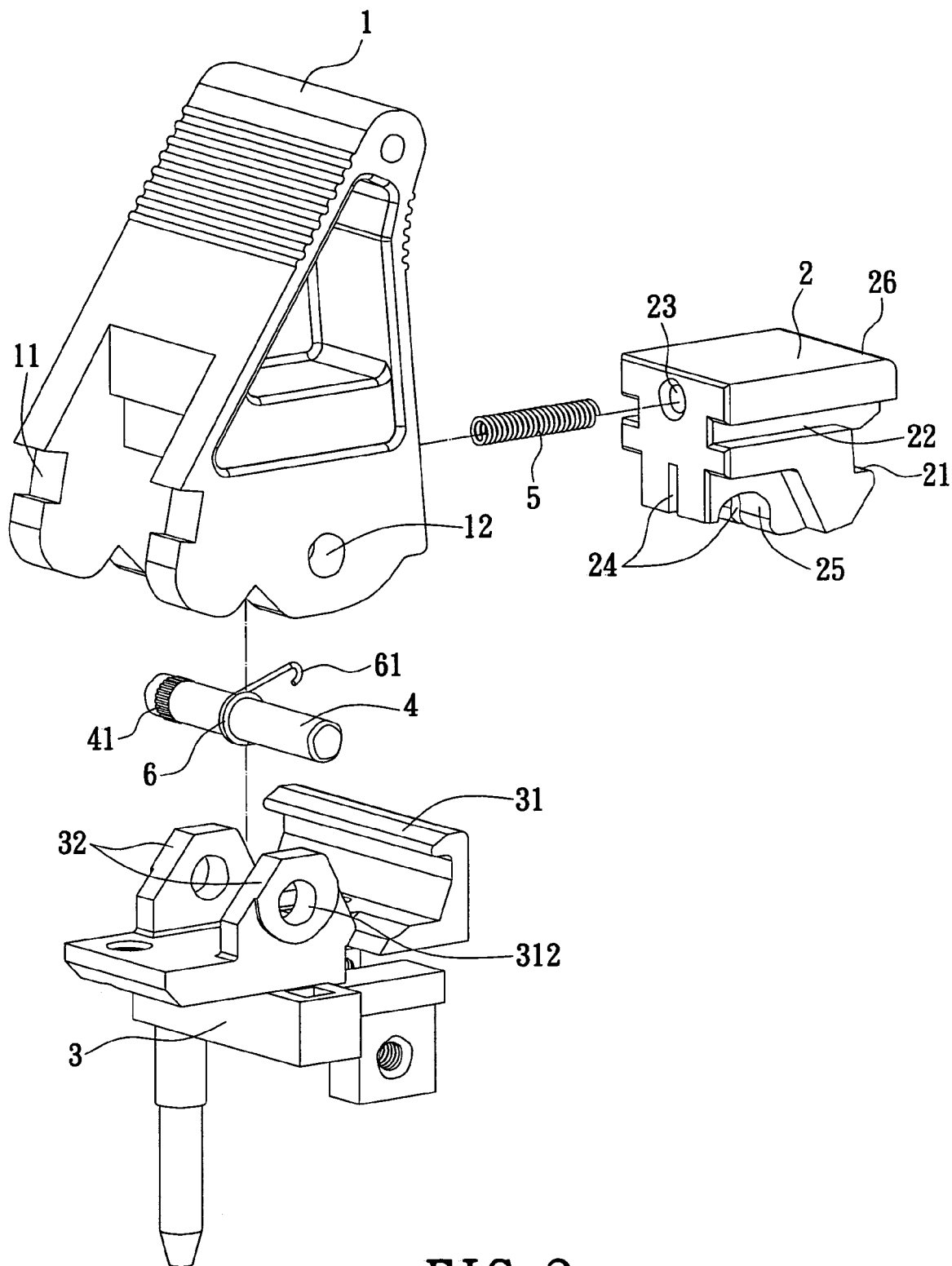
FIG. 2 is an exploded view of the preferred embodiment of the present invention.

Referring to FIG. 2, which is a decomposition view of the preferred embodiment of the present invention. The present invention provides a locking device for a panel including a handle 1, a locking element 2, a seat 3, a pin 4, a first spring 5 and a second spring 6.

Figure 3:
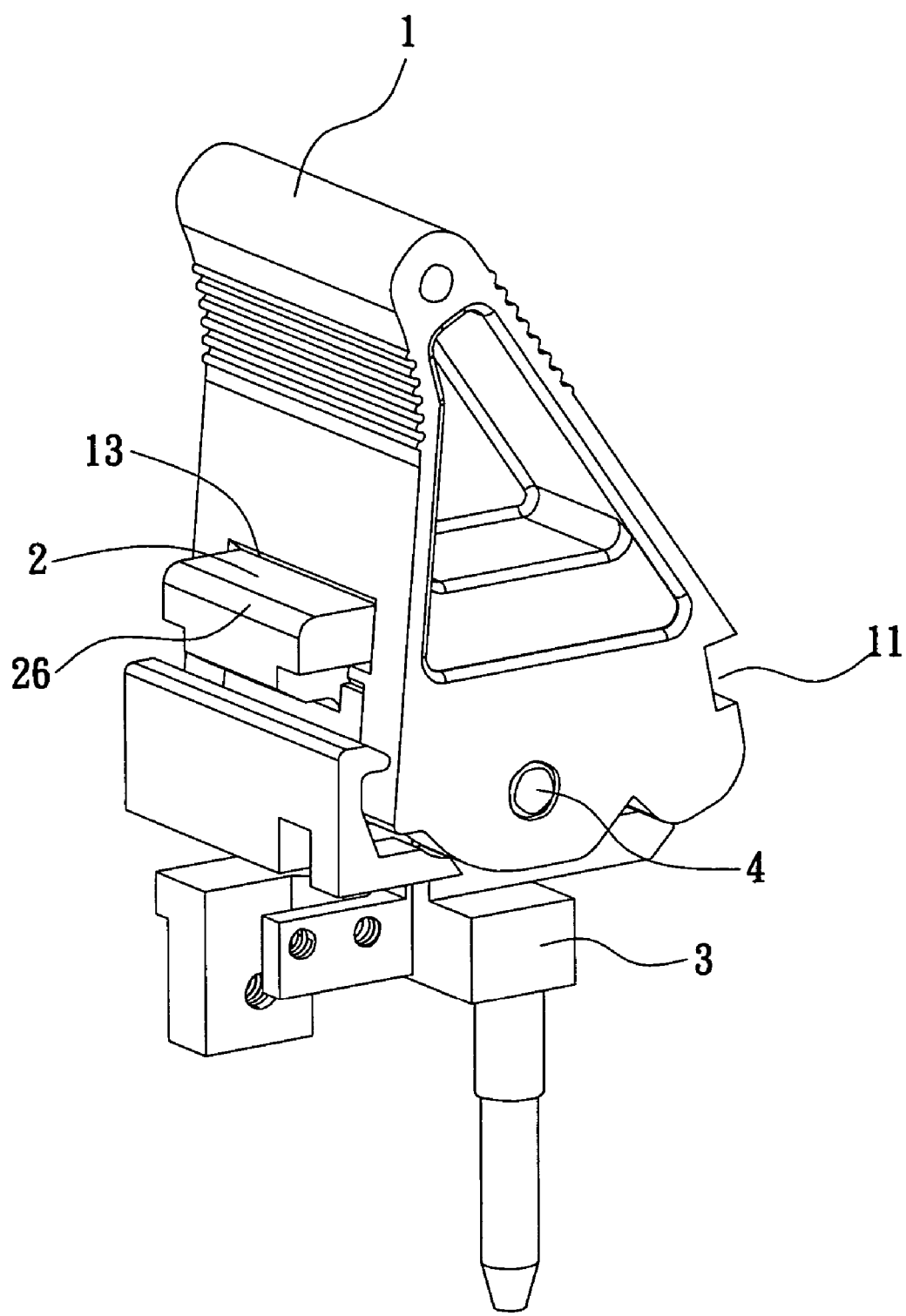
FIG. 3 is a perspective view of the preferred embodiment of the present invention.
Figure 4:
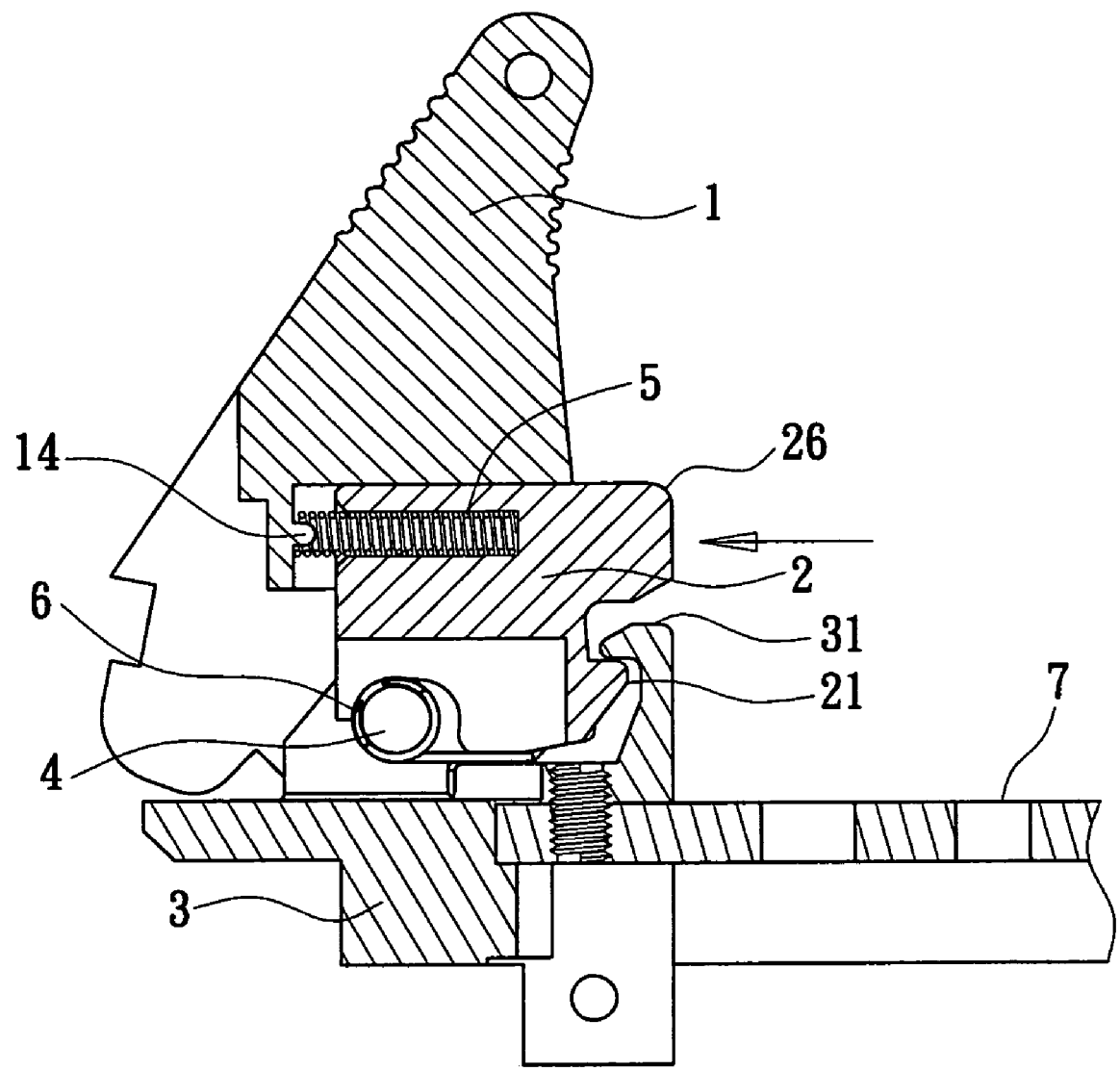
FIG. 4 is a cross-sectional view of the preferred embodiment fixed with the panel in locking situation.

The handle 1 is a triangle/triangular pillar. It has a clasping portion 11 at its rear bottom. The clasping portion 11 is for a panel 7 as shown in FIG. 4 clasping on the chassis of an industrial personal computer. The handle 1 has two first through holes 12 respectively formed on two side bottom edges thereof, and the handle 1 has a concave groove 13 in a front thereof, and the concave groove 13 as shown in FIG. 3 has a pillar 14 in an inner portion thereof.

The locking element 2 has a pressing portion 26 above a front end thereof. The locking element 2 has a first biting portion 21 under the front end thereof. The locking element 2 has two guiding grooves 22 respectively formed on two sides above edges, and the two guiding grooves 22 provide a track for the locking element 2 slipping into the inner portion of the concave groove 13. The locking element 2 has a perforating hole 23 for receiving the first spring 5. The first spring 5 is a compression spring, which is engaged on the pillar 14. The locking element 2 has a bestriding portion 25 for bestriding on the pin 4 and a chamfer 24 on the bottom thereof, and the bestriding portion 25 crosses to the chamfer 24.

The pin 4 is a rod, which has a nonskid portion 41 and a second spring 6. The second spring 6 mounted on the pin 4 is a torsion spring defining a hooking portion 61 for hooking to the chamfer 24 at an end thereof.

The seat 3 has two fixed portions 32 respectively formed on two sides thereof. The two fixed portions 32 respectively define two second through holes 321 corresponding to the first through holes 12, so that the pin 4 passes through the first through holes 12 and the second through holes 321 and pivotally connects to the handle 1 and the seat 3. The nonskid portion 41 limits the pin 4 from penetrating through the first through holes 12 and the second through holes 321 from skidding out. The seat 3 has a second biting portion 31 in a front end thereof for biting to the first biting portion 21.

Figure 5:
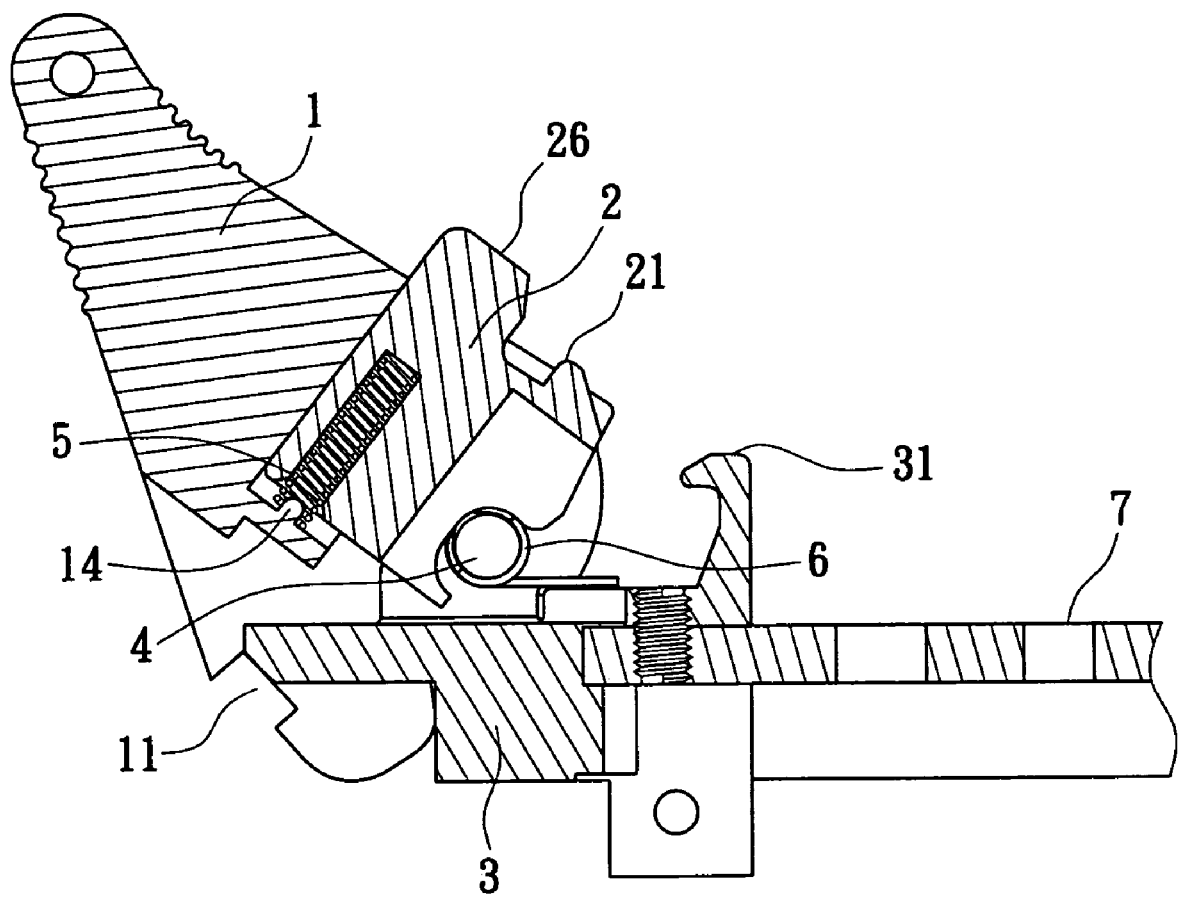
FIG. 5 is a cross-sectional view of the preferred embodiment fixed with the panel in unlocking situation.

Referring to FIG. 4 and FIG. 5, wherein the pressing portion 26 is above the front end of the locking element 2. When the pressing portion 26 is pressed the first spring 5 should be/is compressed and the first biting portion 21 is released from the second biting portion 31. The second spring 6 hooks the locking element 2 through the hooking portion 61 and provides a resilient force for the handle 1 and the locking element 2 through the pin 4 as an axis to move. The clasping portion 61 disengages from the chassis arranged upon the industrial single board computer for easy removal.

There has thus been described a new, novel and heretofore unknown device which eliminates the aforesaid problem of the prior art. Furthermore, those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A locking device for a panel, comprising:
   a handle having two first through holes respectively formed on two side bottom edges thereof;
   a locking element slidably arranged between the two side bottom edges of the handle;
   a first spring placed in an inner portion of the locking element for abutting against an inner portion of the handle;
   a seat having two fixed portions respectively defining two second through holes corresponding to the first through holes;
   a pin passing through the first and second through holes and pivotally connecting the handle to the seat; and
   a second spring mounted on the pin and having an end hooked to the locking element.

2. The locking device of claim 1, wherein the handle has a clasping portion at a bottom rear end thereof for clasping onto a chassis in which single board computers are fixed.

3. The locking device of claim 1, wherein the handle has a concave groove in a front end thereof for accommodating the locking element, and a pillar in the concave groove for engaging with the first spring.

4. The locking device of claim 1, wherein the locking element has a pressing portion above a front end thereof.

5. The locking device of claim 1, wherein the locking element has a first biting portion under the front end thereof, and the seat has a second biting portion in a front end thereof for biting to the first biting portion.

6. The locking device of claim 3, wherein the locking element has two guiding grooves respectively formed on two sides above edges for adapting to the concave groove.

7. The locking device of claim 1, wherein the locking element has a bestriding portion for bestriding on the pin and a chamfer for receiving an end of the second spring on the bottom thereof, and the bestriding portion crosses to the chamfer.

8. The locking device of claim 7, wherein the second spring mounted on the pin is a torsion spring defining a hooking portion for hooking to the chamfer at an end thereof.

9. The locking device of claim 1, wherein the locking element has a perforating hole for receiving the first spring, and the first spring is a compression spring.

* * * * *